(12) United States Patent
Kashiwazaki (10) Patent No.: US 7,679,914 B2
(45) Date of Patent: Mar. 16, 2010

(54) ELECTRONIC CONTROLLER

(75) Inventor: Atsushi Kashiwazaki, Anjo (JP)

(73) Assignee: DENSO CORPORATION, Kariya (JP)

( * ) Notice: Subject to any disclaimer, the term of this patent is extended or adjusted under 35 U.S.C. 154(b) by 194 days.

(21) Appl. No.: 11/902,379

(22) Filed: Sep. 21, 2007

(65) Prior Publication Data

US 2008/0074829 A1 Mar. 27, 2008

(30) Foreign Application Priority Data

Sep. 26, 2006 (JP) .............................. 2006-261320

(51) Int. Cl.
*H05K 7/20* (2006.01)
*H01L 23/34* (2006.01)

(52) U.S. Cl. ..................... 361/714; 361/704; 361/707; 361/718; 257/675; 257/712; 257/713

(58) Field of Classification Search ................ 361/704, 361/707, 718, 722, 723; 257/667, 675, 711–712, 257/719
See application file for complete search history.

(56) References Cited

U.S. PATENT DOCUMENTS

| | | | | |
|---|---|---|---|---|
| 4,571,331 | A * | 2/1986 | Endou et al. ................ | 423/345 |
| 5,035,837 | A * | 7/1991 | Saeki et al. ................. | 252/512 |
| 5,297,006 | A * | 3/1994 | Mizukoshi ................... | 361/704 |
| 5,440,169 | A * | 8/1995 | Tomita et al. ............... | 257/667 |
| 6,693,350 | B2 * | 2/2004 | Teshima et al. ............ | 257/712 |
| 6,703,707 | B1 | 3/2004 | Mamitsu et al. | |
| 6,794,747 | B2 * | 9/2004 | Takehara et al. ........... | 257/705 |
| 6,798,062 | B2 | 9/2004 | Mamitsu et al. | |
| 6,891,265 | B2 | 5/2005 | Mamitsu et al. | |
| 6,960,825 | B2 | 11/2005 | Mamitsu et al. | |
| 6,967,404 | B2 | 11/2005 | Mamitsu et al. | |
| 6,992,383 | B2 | 1/2006 | Mamitsu et al. | |
| 6,998,707 | B2 | 2/2006 | Fukuda et al. | |
| 7,208,816 | B2 * | 4/2007 | Kawakami et al. ......... | 257/666 |

(Continued)

FOREIGN PATENT DOCUMENTS

JP A-06-163812 6/1994

(Continued)

OTHER PUBLICATIONS

English machine translation of JP 2006-086296.*

(Continued)

*Primary Examiner*—Jayprakash N Gandhi
*Assistant Examiner*—Robert J Hoffberg
(74) *Attorney, Agent, or Firm*—Posz Law Group, PLC (57) ABSTRACT

An electronic controller having a circuit board with an element disposed thereon, a base member with the circuit board adhered thereon and a lead terminal in an electrical connection with the circuit board includes as the elements thick film resistors and electric components soldered by solder on a bottom side of the circuit board, and also includes electronic components including bare chips being at least wired without soldering on a top surface of the circuit board. The electronic controller has a first concave portion at a position corresponding to a position of the components on a surface that has the circuit board of the base member adhered thereon, and the circuit board is molded by a sealing resin so as to expose a portion of the base member and a portion of the lead terminal.

2 Claims, 6 Drawing Sheets

U.S. PATENT DOCUMENTS

| | | | |
|---|---|---|---|
| 7,365,273 B2 * | 4/2008 | Fairchild et al. | 174/260 |
| 2004/0084756 A1 | 5/2004 | Kawakami et al. | |
| 2004/0089940 A1 | 5/2004 | Mamitsu et al. | |
| 2004/0089941 A1 | 5/2004 | Mamitsu et al. | |
| 2005/0046032 A1 | 3/2005 | Naruse et al. | |
| 2006/0267184 A1 * | 11/2006 | Kinsman et al. | 257/712 |
| 2007/0200225 A1 * | 8/2007 | Ibrahim et al. | 257/712 |
| 2008/0128920 A1 * | 6/2008 | Enomoto et al. | 257/783 |
| 2008/0170372 A1 * | 7/2008 | Kirigaya | 361/720 |

FOREIGN PATENT DOCUMENTS

| | | |
|---|---|---|
| JP | A-11-168171 | 6/1999 |
| JP | A-2001-352185 | 12/2001 |
| JP | A-2006-086296 | 3/2006 |

OTHER PUBLICATIONS

Engh machine translation of JP 11-168171.*

Extended Search Report dated Jan. 21, 2008 in corresponding European Patent Application No. 07 018 411.4-2214 (and English translation).

* cited by examiner

ELECTRONIC CONTROLLER

CROSS REFERENCE TO RELATED APPLICATION

This application is based on and claims the benefit of priority of Japanese Patent Application No. 2006-261320 filed on Sep. 26, 2006, the disclosure of which is incorporated herein by reference.

FIELD OF THE DISCLOSURE

The present disclosure generally relates to an electronic controller for use in a vehicle.

BACKGROUND INFORMATION

As an electronic controller that: is placed in a severe environment (in terms of mountability, heat resistance, oil resistance, etc.) in which an engine room, a transmission, etc. are used; and controls an engine, an automatic transmission, and the like for example, an electronic controller having such a structure as shown in, for example, JP-A-2004-119465 or JP-A-2006-86296 is disclosed. (JP-A-2004-119465 is also published as a patent document US2004-084756)

An electronic controller shown in JP-A-2004-119465: comprises a circuit board on a surface (the top surface) of which elements (circuit elements) are mounted and, on the other surface (the bottom surface) thereof, thick film resistors (printed resistors) as other elements are formed, a base member (a base) to which the circuit board is bonded using the surface on which the thick film resistors are formed as the bonded surface, and members other than the base member; and is provided with external connecting terminals (lead terminals) electrically connected to the base member. Further, except parts of flanges formed in the base member in order to fix the electronic controller and release heat and parts of the external connecting terminals, the circuit board, the base member, the external connecting terminals, and the flanges are molded in a lump with sealing resin (molding resin).

An electronic controller shown in JP-A-2006-86296 has a circuit board on a surface (the bottom surface) of which, the surface being bonded to a base member (a radiator plate), thick film resistors as elements and all the electronic components (including bare chips (semiconductor chips)) mounted not by soldering are mounted by the method of flip chip for example and, on the other surface (the top surface) thereof, all the electronic components (including microcomputers (IC chips)) including chip resistors as other elements are mounted by soldering. Further, a recess (a first concave portion) is formed at the position corresponding to the electronic components mounted on the circuit board on the surface of the base member to which the circuit board is bonded. Furthermore, the electronic controller is molded with sealing resin (resin) in the state where parts of external connecting terminals (electrodes for external connection) and a part of the base are exposed to exterior.

In the configuration shown in JP-A-2004-119465, the area of the thick film resistors on the bottom surface of the circuit board is not identical to the area of the elements on the top surface of the circuit board, the board size is restricted by the area of either of the surfaces, and that is an obstacle to the efficient downsizing of the board. More specifically, the area where the thick film resistors are formed on the bottom surface is smaller than the area where the elements are mounted on the top surface. Consequently, the area of the circuit board is restricted by the top surface of the board and a useless space appears on the surface on which the thick film resistors are formed. That is not desirable from the viewpoint of mountability (downsizing) and heat dissipativity.

Further, with regard to the elements mounted on the top surface of the circuit board, soldered elements and non-soldered elements (for example, bare chips bonded and fixed with an electrically conductive adhesive and connected with wire) coexist. Hence, in order to avoid defective bond at the wire connection of elements caused by solder spattering or flux residues after the mounting by soldering, it is necessary to: stick a masking tape to a site to which wire is connected when an element is mounted by soldering; peel off the masking tape after the mounting; and further apply wet cleaning or plasma cleaning. Meanwhile, when soldering is applied in advance, since the surface of the board on which elements are already mounted is not flat, successively an electrically conductive adhesive cannot be supplied at one time by printing, thus the adhesive must be supplied one spot by one spot with a dispenser or the like, and productivity deteriorates considerably. The coexistence of such soldered elements and non-soldered elements on a same plane as stated above makes processes very complicated.

Meanwhile, when an electronic controller is mounted on a place where the temperature environment is very severe, such as mounted directly on an engine or incorporated into a transmission, cracking and exfoliation of sealing resin must be particularly taken into consideration. As a mold size increases, thermal strain increases and cracking and exfoliation of sealing resin tend to occur. In JP-A-2004-119465 however, the downsizing of a circuit board is limited as stated above and hence it is configured so that a base member (except flange portions) may not be exposed from sealing resin in order to prevent the cracking and exfoliation of the sealing resin. Consequently, it is not desirable from the viewpoint of heat dissipativity.

In contrast, in the configuration shown in JP-A-2006-86296, electronic components, in addition to the thick film resistors, are mounted on the bottom surface of the circuit board and a first concave portion is formed at the position of the base member corresponding to the electronic components. Consequently, the circuit board and the electronic controller can be downsized in comparison with the configuration shown in JP-A-2004-119465. Further, electronic components attached not by soldering are mounted on the bottom surface of the circuit board and electronic components attached by soldering are mounted on the top surface thereof. It is possible therefore to simplify the mounting processes without the complication of the processes caused by the coexistence of the mounting by soldering and non-soldering. Furthermore, since a part of the base member is exposed from the sealing resin, heat dissipativity can be improved in comparison with the configuration shown in JP-A-2004-119465.

In JP-A-2006-86296 however, it is configured so that semiconductor chips are mounted in the state of bare chips on the bottom surface of the circuit board by the method of flip chip. Consequently, the dimensional accuracy of electrodes (lands) and accuracy of distance between electrodes on the circuit board connected to bumps are severe, further warpage occurs in the board due to heat at the forming of the circuit board or the like (for example, baking at the forming of a ceramic substrate, or the like), and hence it is likely to deteriorate the reliability in connection between elements and the circuit board. Here, when elements are connected with wire on the bottom surface of the circuit board, in the event of bonding and fixing the circuit board to the base member, it is likely to get pressure and break wire and deteriorate the reliability in connection between elements and the circuit board. In addition, the size of the first concave portion (gap between the circuit board and the base member) increases to the extent corresponding to the wire and hence it is not desirable from the viewpoint of heat dissipativity.

SUMMARY OF THE DISCLOSURE

In view of the above and other problems, the present disclosure provides an apparatus that provides an electronic controller that makes it possible to realize downsizing, improve heat dissipativity as well as reliability, and to simplify mounting processes.

The present invention to attain the above object is, in an electronic controller provided with a circuit board on which elements constituting a circuit are mounted, a base member to which the circuit board is bonded and fixed, and external connecting terminals electrically connected to the circuit board, characterized in that: thick film resistors are disposed as elements and electronic components mounted by soldering are also disposed on the surface of the circuit board bonded to the base member (hereunder referred to as a bottom surface); electronic components as elements including bare chips mounted not by soldering but at least connected by wiring are disposed on the surface of the circuit board opposite the surface thereof bonded to the base member (hereunder referred to as a top surface); a first concave portion is formed at the position corresponding to the electronic components mounted on the circuit board on the surface of the base member to which the circuit board is bonded; and the circuit board is molded with sealing resin in the state where a part of the base member and parts of the external connecting terminals are exposed to exterior respectively.

As stated above in the present invention, electronic components, in addition to thick film resistors, are mounted on the bottom surface of a circuit board and the first concave portion is formed at the portion of a base member corresponding to the electronic components. Consequently, a circuit board and an electronic controller can be downsized. Further, electronic components attached by soldering are mounted on the bottom surface of the circuit board and electronic components attached not by soldering are mounted on the top surface. Consequently, the mounting processes can be simplified without the complication of the processes caused by the coexistence of mounting by soldering and mounting by non-soldering. Furthermore, among elements, bare chips are disposed on the top surface of the circuit board and electrically connected to the circuit board by wire connection. Consequently, reliability in connection and heat dissipativity can be improved in comparison with the configuration wherein elements mounted by non-soldering are dispose on the bottom surface of the circuit board. In addition, a part of the base member is exposed from sealing resin and hence heat dissipativity can be improved. That is, it is possible to realize downsizing, to improve heat dissipativity and reliability in associative manner, and to simplify mounting processes.

Here, electronic components disposed on the bottom surface of the circuit board are mounted by soldering and hence they are not bare chips and are packaged.

BRIEF DESCRIPTION OF THE DRAWINGS

Other objects, features and advantages of the present invention will become more apparent from the following detailed description made with reference to the accompanying drawings, in which.

DETAILED DESCRIPTION

Embodiments of the present invention are hereunder explained in reference to drawings.

First Embodiment

Figure 1:
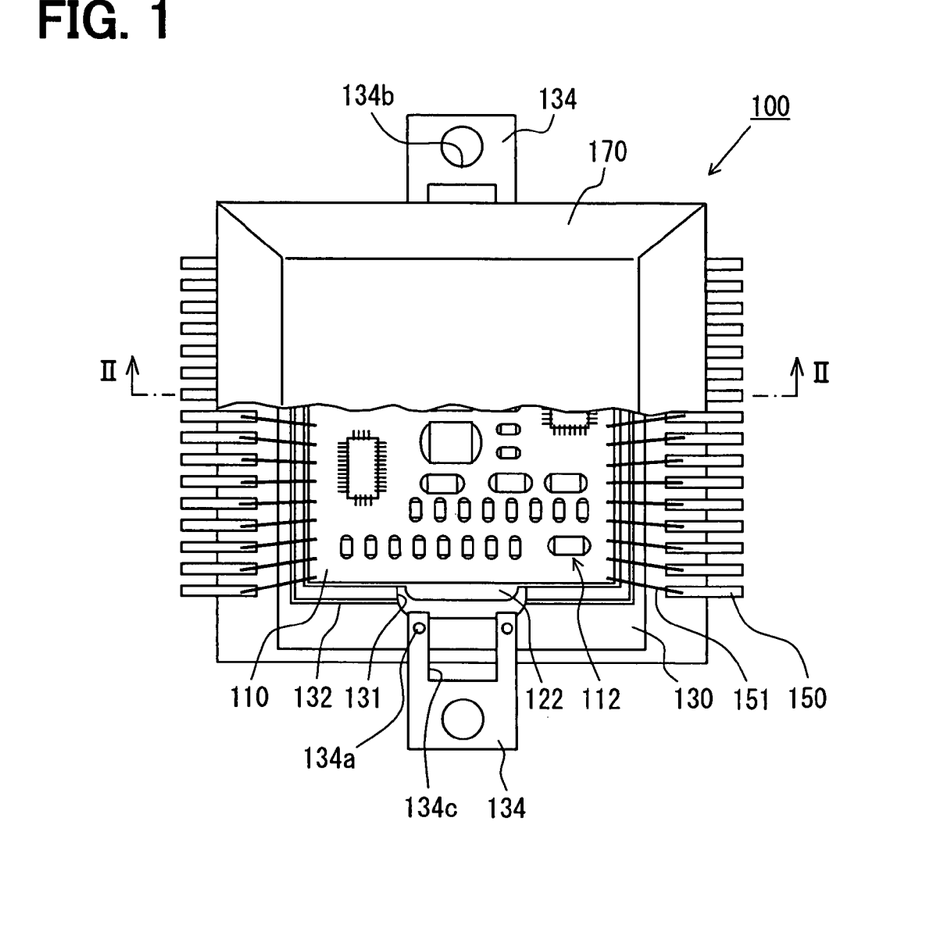
FIG. 1 shows a plan view of an electronic controller in a first embodiment of the present disclosure.
Figure 2:
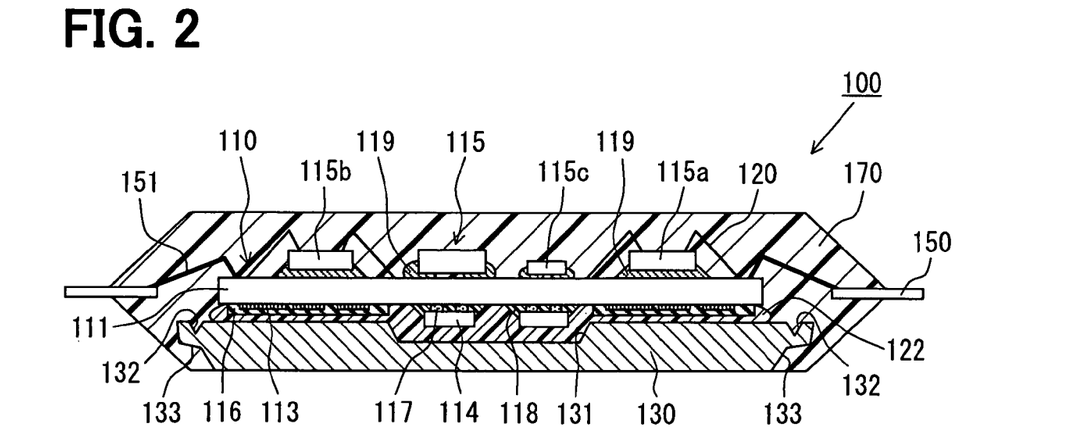
FIG. 2 shows a cross-sectional view of the electronic controller along a line II-II shown in FIG. 1.
Figure 3:
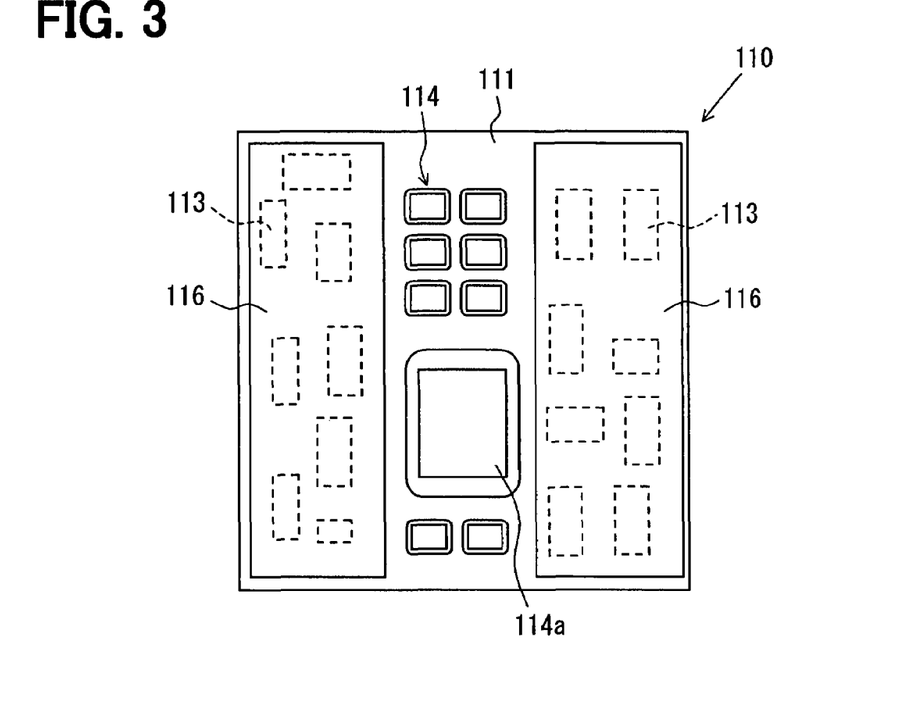
FIG. 3 shows a plan view of a lower side of a circuit board.
Figure 4:
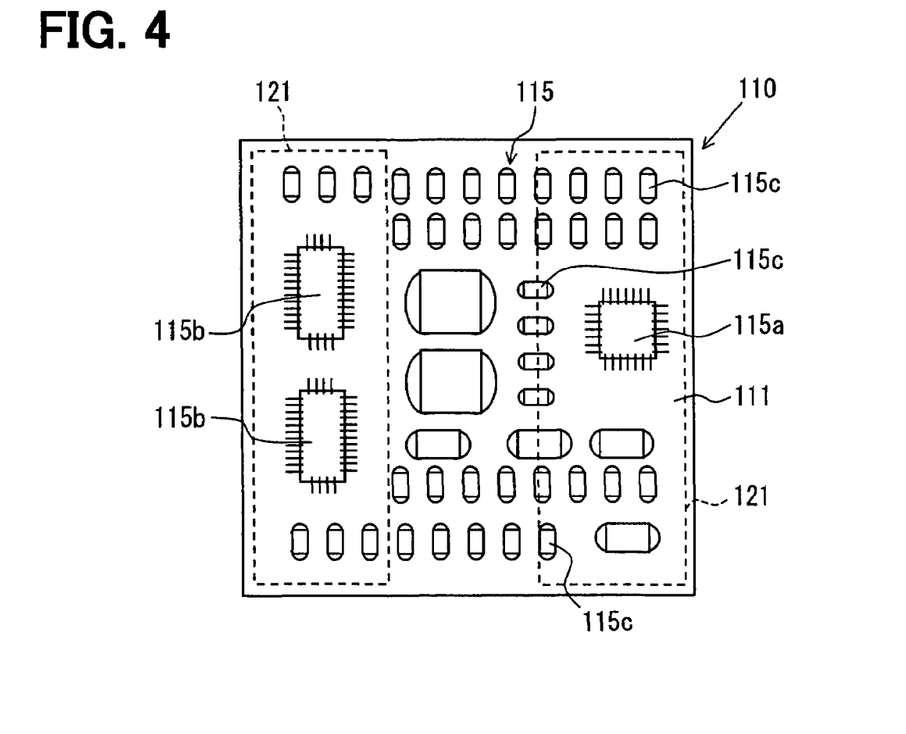
FIG. 4 shows a plan view of an top side of a circuit board.
Figure 5:
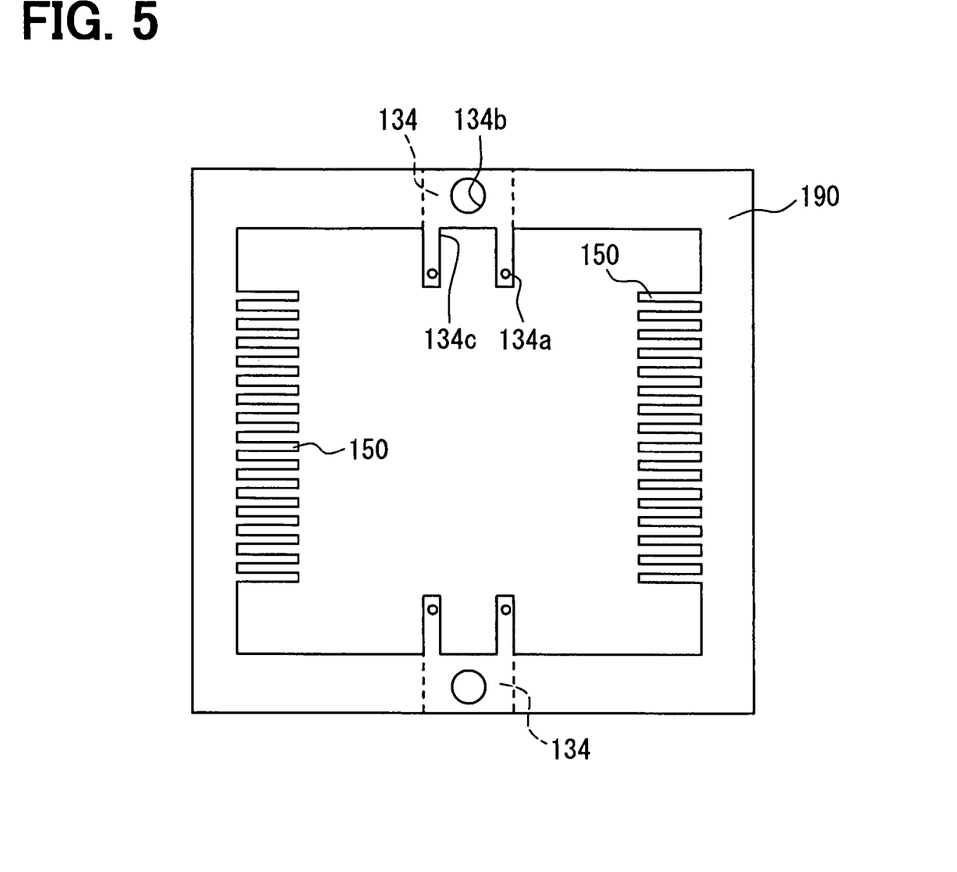
FIG. 5 shows a plan view of a lead frame including a lead terminal and a flange.

FIG. 1 is a plan view showing the general configuration of an electronic controller according to the first embodiment of the present invention. FIG. 2 is a sectional view taken on the line I-I shown in FIG. 1. FIG. 3 is a plan view showing the general configuration on the bottom surface of a circuit board. FIG. 4 is a plan view showing the general configuration on the top surface of a circuit board. FIG. 5 is a plan view showing the general configuration of a lead frame including lead terminals and flange portions. Here in FIG. 1, the sealing resin is partially removed for convenience. An electronic controller according to the present embodiment is suitably used as a vehicle-mounted electronic controller. More specifically, an electronic controller according to the present embodiment is attached as an electronic controller of an automatic transmission in the form of a module integrated with solenoid valves and various kinds of sensors in a valve body disposed in the interior of the automatic transmission.

As shown in FIGS. 1 and 2, an electronic controller 100 comprises, as substantial components: a circuit board 110; a base member 130 to which the circuit board 110 is bonded and fixed; lead terminals 150 electrically connected to the circuit board 110; and a sealing resin 170 to mold (seal) the circuit board 110 in the state where a part of the base member 130 and parts of the lead terminals 150 are exposed to exterior, respectively.

The circuit board 110 is configured by mounting elements 112 composing a circuit, together with a wiring pattern (not shown in the figures), on a wiring substrate 111 formed by disposing the wiring pattern on a substrate. The elements 112 are disposed on both the top and bottom surfaces of the circuit board 110 (the wiring substrate 111) respectively. More specifically, as shown in FIGS. 2 to 4, thick film resistors 113 are disposed as elements 112 and electronic components 114 are also disposed on the surface, of the circuit board 110, bonded to the base member 130 (hereunder referred to as the bottom surface). Meanwhile, electronic components 115 are disposed as elements 112 on the surface of the circuit board 110 opposite the surface thereof bonded to the base member 130 (hereunder referred to as the top surface).

The constituent material of the circuit board 110 (the wiring substrate 111) is not particularly limited. A resin substrate may be adopted but, in the present embodiment, a ceramic multilayer substrate (a ceramic substrate in the broad sense of the term) is adopted. More specifically, a ceramic multilayer substrate having seven layers and a square shape (31 mm square) in a plan view is adopted. Since the thermal conductivity of a ceramic multilayer substrate (10 W/mK or more for example) is higher than the thermal conductivity of a resin substrate (about 1 W/mK for example), by adopting a ceramic multilayer substrate as stated above, heat dissipativity is improved. Further, the linear expansion coefficient of a ceramic multilayer substrate (5 to 7 ppm/° C. for example) is smaller than the linear expansion coefficient of a general resin substrate (9 to 17 ppm/° C. for example) and is close to the linear expansion coefficient of the elements 112 (114, and 115) (3 to 10 ppm/° C. for example), and hence it is possible to improve the reliability in the connection of the elements 112 (114, and 115) to the circuit board 110. Furthermore, the heat resistance of a ceramic multilayer substrate is higher than that of a resin substrate and it is possible to improve the reliability in an environment wherein thermal load is heavy.

Among the elements 112 disposed on the bottom surface of the circuit board 110, the thick film resistors 113 are formed by printing and the surfaces thereof are covered with dielectric films 116. Among the elements 112, the electronic components 114 are elements mounted with solder 117. That is, the electronic components 114 are not in the state of bare chips but packaged. In the present embodiment, as shown in FIGS. 2 and 3, the electronic components 114: include a memory built-in microcomputer 114a the quality of which is assured, diodes, and others; are disposed on electrode pads (not shown in the figures); and are mechanically and electrically connected to relevant lands (not shown in the figures) in the circuit board 110 through bump electrodes (including solder balls) formed using solder 117 (for example, lead-free solder comprising 3% silver, 0.5% copper, and 96.5% tin) as the material. That is, the electronic components 114 are mounted by the flip chip method. By adopting such a mounting structure, it is possible to downsize the circuit board 110 in the planar direction of the circuit board 110 in comparison with a configuration wherein lands are disposed outside the electronic components 114. However, a configuration other than flip chip mounting can be adopted as long as the electronic components 114 are mounted on a surface through solder 117 in the configuration. Here, the reference numeral 118 shown in FIG. 2 represents an underfiller disposed between the opposing surfaces of the electronic components 114 and the bottom surface of the circuit board 110. The underfiller 118 makes it possible to alleviate stress to a joint and improve reliability in connection. In the present embodiment, the gaps between the electronic components 114 and the circuit board 110 are narrow (about 0.1 to 0.2 mm) and thus an adhesive 122 that will be described later hardly intrudes between the opposing surfaces. For that reason, resin having better permeability than the adhesive 122 is used as the constituent component and the underfiller 118 is applied before the adhesive 122 is applied.

Further, in the present embodiment, the region where the thick film resistors 113 are disposed is separated from the region where the electronic components 114 are disposed on the bottom surface of the circuit board 110. More specifically, as shown in FIG. 3, the electronic component allocated region where a plurality of electronic components 114 are disposed is interposed between the thick film resistor allocated regions where a plurality of thick film resistors 113 are disposed so as to be not closed with the thick film resistor allocated regions.

The electronic components 115 as elements 112 disposed on the top surface of the circuit board 110: are the elements mounted not by soldering among the elements 112 except the thick film resistors 113; and include at least bare chips connected by wiring. In the present embodiment, as shown in FIGS. 2 and 4, the electronic components 115 include an electric power supply IC 115a to generate and supply electric power for electronic control from a battery power source, driver ICs 115b for solenoid driving, and passive components such as ceramic chip resistors 115c (corresponding to chip resistors shown in the claims), ceramic laminated condensers, and the like. Here, among the electronic components 115, the electric power supply IC 115a and the driver ICs 115b are the elements having a large heat value (heater elements) and are in the state of bare chips in the present embodiment. Consequently, the electric power supply IC 115a and the driver ICs 115b as bare chips are bonded and fixed to the top surface of the circuit board 110 with an electrically conductive adhesive 119 (silver paste in the present embodiment) and electrodes (not shown in the figures) are electrically connected to the lands (not shown in the figures) of the circuit board 110 with wire 120 (gold wire for example). Further, in the case of the electronic components 115 other than those connected by wiring (including the ceramic chip resistors 115c), the electrodes (not shown in the figures) are electrically connected to the circuit board 110 with the electrically conductive adhesive 119.

Further, the electric power supply IC 115a and the driver ICs 115b as heater elements are, as shown in FIG. 4, disposed at positions 121 (the positions surrounded by the broken lines) on the top surface of the circuit board 110 corresponding to the positions where the thick film resistors 113 are disposed. The gap between the bottom surface of the circuit board 110 and the opposing surface of the base member 130 in the thick film resistor allocated region is narrower than the gap in the electronic component allocated region because of a first concave portion 131 that will be described later. Furthermore, the thickness of the adhesive 122 can be controlled easier in the thick film resistor allocated region than in the electronic component allocated region. Consequently, by adopting such a configuration, it is possible to dissipate the heat generated in the heater elements 115a and 115b more efficiently to the side of the base member 130 in spite of the configuration wherein the heater elements 115a and 115b are disposed on the top surface of the circuit board 110.

In this case, the dimensional accuracy of lands and accuracy of distance between lands on the circuit board 110 corresponding to the bare chip elements 112 are severer than those of the packaged elements 112 and warpage occurs in the circuit board 110 due to heat at the forming of the circuit board (for example, baking at the forming of a ceramic multilayered substrate). Consequently, displacement may occur between the electrodes of the bare chips and the lands of the circuit board 110 and reliability in connection is likely to deteriorate. In the present embodiment however, the electric power supply IC 115a and the driver ICs 115b as bare chips are not by the flip chip mounting but electrically connected to the circuit board 110 with wire 120. That is, the lands are disposed outside the electronic components 114 in the planar direction of the circuit board 110. Consequently, reliability in connection can be improved. Further, since the fine wire 120 itself deforms elastically and can alleviate stress, reliability in connection can be further improved.

Furthermore, if the elements 112 connected by wiring are disposed on the bottom surface of the circuit board 110, in the event of bonding and fixing the circuit board 110 to the base member 130, the wire 120 gets pressure and breaks and reliability in connection between the elements 112 and the circuit board 110 is likely to deteriorate. In addition, the gap between the circuit board 110 and the base member 130 increases to the extent corresponding to the wire 120 and hence heat dissipativity is likely to deteriorate. In the present embodiment however, since the elements 112 connected by wiring are disposed on the top surface of the circuit board 110, it is possible to prevent the deterioration of reliability in connection and heat dissipativity.

Further, the guaranteed resistance accuracy of a thick film resistor 113 is about ±30% in general and, when thick film resistors 113 are adopted as resistance elements requiring accuracy (for example, ±0.5% or ±5%), it is necessary to adjust the resistance one by one by trimming with laser or the like while measuring the resistance after the thick film resistors 113 are formed. The adjustment process causes the cost of the circuit board 110 to increase considerably. In the present embodiment however, the resistance elements include the thick film resistors 113 and the ceramic chip resistors 115c, the ceramic chip resistors 115c are adopted as the resistance elements requiring accuracy of resistance, and at least the thick film resistors 113 are adopted as the resistance elements not requiring accuracy. By adopting such a configuration, the trimming process can be avoided and the cost of the circuit board 110 can be lowered. In an electronic controller 100 in an automatic transmission as shown in the present embodiment, the ceramic chip resistors 115c (requiring accuracy) may be used as at least resistors for pull-up of temperature detection input signals and resistors for electric current feedback control in a solenoid drive circuit and the thick film resistors 113 (not requiring accuracy) may be used as at least resistors for pull-up and pull-down of gear change position detection SW input, resistors for the protection of the above SW input, and resistors for fixing the voltage of unused terminals for microcomputers. Here, the ceramic chip resistors 115c may be applied not only to the control of an automatic transmission but also to, for example, resistors for electric current detection and the like when electric current FB control is applied in an H bridge circuit to send electricity to a motor for electronic throttle drive and an injector drive circuit at common rail injection, and the thick film resistors 113 may be applied to resistors for pull-up and pull-down of SW input at SWs showing the turn-on and turn-off of an air conditioner and the like.

Furthermore, as elements not requiring accuracy, not only the thick film resistors 113 but also the ceramic chip resistors 115c can be adopted. In the present embodiment, the resistance elements are allocated to the thick film resistors 113 and the ceramic chip resistors 115c so that the area occupied by the elements 112 may be equally separated to the top and bottom surfaces of the circuit board 110. By adjusting the balance of the area of the circuit board 110 occupied by elements in accordance with the shapes of the resistance elements as stated above, it is possible to downsize the circuit board 110 efficiently.

The circuit board 110 thus configured is bonded and fixed to the base member 130 using the bottom surface as the bonded surface with an adhesive 122. As the adhesive 122, any adhesive can be adopted as long as the adhesive can firmly bond the circuit board 110 to the base member 130 and has characteristics required in the usage environment (heat resistance for example). It is desirable to adopt an adhesive that has heat resistance, a high thermal conductivity, and an appropriate elastic coefficient to the extent of alleviating stress (improving reliability in connection at a joint) while the circuit board 110 is maintained at a prescribed position. In the present embodiment, a silicon type adhesive 122 having a thermal conductivity of 2.0 to 2.5 W/mK and an elastic coefficient of 5 to 20 MPa at room temperature is employed. Further, the gap between the opposing surfaces of the thick film resistor allocated region in the circuit board 110 and the base member 130 in the state where the adhesive 122 is interposed between the circuit board 110 and the base member 130 (the thickness of the adhesive 122 applied to the relevant portions) is 0.3 mm or less. By narrowing the gap between the opposing surfaces of the thick film resistor allocated region and the base member 130 as stated above, heat dissipativity can be improved.

The base member 130 is a tabular member to which the circuit board 110 is bonded and fixed. As the constituent material of the base member 130, any material can be adopted as long as the material has heat dissipativity superior to that of the circuit board 110. It is desirable to adopt a material having high heat dissipativity (a high thermal conductivity), a linear expansion coefficient close to those of the circuit board 110 and sealing resin 170 that will be described later, and a small elastic coefficient. In the present embodiment, a material produced by applying nickel plating to iron having a thermal conductivity of 60 to 70 W/mK, a linear expansion coefficient of 11 ppm/° C., and an elastic coefficient of about 210 GPa is adopted. By adopting a material the linear expansion coefficient of which is close to that of the circuit board 110 (7 ppm/° C. for example) and that of the sealing resin 170 (8 to 12 ppm/° C. for example as described later), it is possible to reduce the stress caused by the difference in linear expansion coefficient in accordance with temperature change and the incidence of exfoliation and cracking in the sealing resin 170. Further as it will be described later, since a part of the base member 130 is exposed to exterior, it is possible to adopt iron that has a moderate thermal conductivity and is an inexpensive material.

The size and the shape of the base member 130 are not particularly limited. The area of the base member 130 may be identical to or different from (larger or smaller than) the area of the circuit board 110 in the planar direction of the circuit board 110. The shape of the base member 130 may also be identical to or different from the shape of the circuit board 110. In the present embodiment, the base member 130 has a rectangular shape in a plan view and is set at a size larger than that of the circuit board 110 so that the bottom surface of the circuit board 110 may be completely placed on the base member 130. By adopting such a configuration, the circuit board 110 can be easily positioned on the base material 130 using the base member 130 as the standard. Further, heat from the circuit board 110 can be dissipated efficiently.

As shown in FIGS. 1 and 2, a first concave portion 131 is formed at the position, on the surface of the base member 130 to which the circuit board 110 is bonded, corresponding to the position of the electronic components 114 mounted on the bottom surface of the circuit board 110. The purpose of the first concave portion 131 is to avoid the contact (interference) with the electronic components 114. The first concave portion 131 may be either a groove or a hole. If the recess is deeper than necessary however, the gap between the circuit board 110 and the base member 130 increases at the relevant portion and that causes heat dissipativity to deteriorate. In the present embodiment, taking the above situation into consideration, the depth of the first concave portion 131 is designed so as to be nearly equal to the height of the electronic components 114. More specifically, the depth of the first concave portion 131 is set at 0.72 mm in conformity with the fact that the maximum height of the electronic components 114 is 0.7 mm.

When a plurality of electronic components 114 are mounted on the bottom surface of the circuit board 110, a first concave portion 131 may be formed for each of the electronic components 114 but it is also possible to form one first concave portion 131 for plural electronic components 114. In the present embodiment, as stated above, two thick film resistor allocated regions and one electronic component allocated region are formed independently from each other on the bottom surface of the circuit board 110 and one first concave portion 131 is formed for all the electronic components 114 in the electronic component allocated region. By adopting such a configuration, the base member 130 can be simplified. Further, as shown in FIG. 1, a part of the first concave portion 131 extends up to a position on the base member 130 outside the region where the circuit board 110 is disposed in the planar direction of circuit board 110. More specifically, the first concave portion 131 is formed in conformity with the electronic component allocated region so that both the ends thereof may be exposed outside the region where the circuit board 110 is disposed and the first concave portion 131 may not open to the end face (the side face except the surface to which the circuit board 110 is bonded and the bottom surface thereof) in the state where the circuit board 110 is placed. That is, the first concave portion 131 is a hole. By employing such a configuration, when the circuit board 110 is bonded and fixed to the base member 130, gas (air) in the first concave portion 131 can escape to exterior through the part of the first concave portion 131 located outside the region where the circuit board 110 is placed. Consequently, the generation of voids in an adhesive 122 can be suppressed.

Further, in the base member 130 according to the present embodiment, a second recess 132 is formed at a position of the base member 130 touching the sealing resin 170. The second recess 132 may be a groove or a hole. In the present embodiment, as shown in FIGS. 1 and 2, as the second recess 132, a groove having a V-shape in cross section is formed at a portion, on the surface to which the circuit board 110 is bonded, outside the region where the circuit board 110 is placed in the manner of surrounding the circuit board 110. Furthermore, a step 133 is formed at a position of the base member 130 touching the sealing resin 170. In the present embodiment, as shown in FIG. 2, the step 133 is formed in the manner of extending from the end face of the base member 130 to the surface opposite the surface to which the circuit board 110 is bonded. By forming the second recess 132 and the step 133, the area of the base member 130 touching the sealing resin 170 increases and the peeling resistance of the sealing resin 170 improves by a so-called anchor effect. Here, the second recess 132 exhibits both the area increase and the anchor effect and the step 133 exhibits at least a kind of anchor effect.

Further, the base member 130: plays the role of a fixture to fix other members (members to be fixed such as an engine and a transmission to which the electronic controller 100 is attached); and has flanges 134 exposed to exterior. The flanges 134 according to the present embodiment are: made of the same material as the leads 150; and connected and fixed to the base member 130. More specifically, as shown in FIG. 5, a lead frame 190 that is made of, for example, a copper alloy and integrally incorporates the flanges 134 and lead terminals 150 is adopted. Further, the joints 134a of the flanges 134 are connected to the base member 130 by the plastic deformation of metal through pressurization and thus the whole lead frame 190 is fixed to the base member 130. After connecting the lead terminals 150 to the circuit board 110 and molding them with the sealing resin 170, unnecessary portions of the lead frame 190 except the flanges 134 and the lead terminals 150 are removed (punched out). By adopting such a configuration, costs (material cost and processing cost) can be reduced.

Here, the reference character 134b shown in FIGS. 1 and 5 represents tapped holes to fix the flanges 134 to another member with screws. Further, the reference character 134c represents stress relievers that are formed at portions of the flanges 134 and mitigate stress at fixation. Each of the stress relievers 134c is formed between a tapped hole 134b and the sealing resin 170 and lowers the transfer of stress to the sealing resin 170 by, for example, elastically deforming at the transfer of the stress. In the present embodiment, two beams are formed so as to be flexible in a manner of extending from a portion having a tapped hole 134b and separating from each other at each of the flanges 134. Further, a joint 134a is formed in the vicinity of the tip of each beam. Then, in the state of being molded, parts of the beams including the joints 134a are sealed with the sealing resin 170, the rest parts are exposed to exterior, and slits are formed between the sealing resin 170 and the flanges 134 as shown in FIG. 1. In the beams, the portions where the slits are formed are the stress relievers 134c. By adopting a configuration having such stress relievers 134c, stress at fixation can be mitigated with the stress relievers 134c in the flanges 134 and hence it is possible to: suppress the transfer of the stress to the sealing resin 170; and reduce cracking and exfoliation occurring in the sealing resin 170.

The lead terminals 150: electrically connect circuits formed in the circuit board 110 to exterior; and correspond to the external connecting terminals described in the claims. Lead terminals 150 according to the present embodiment are: formed as parts of the lead frame 190 as stated above; and, as shown in FIGS. 1 and 2, electrically connected to the electrodes (not shown in the figures) of the circuit board 110 with wire 151 (aluminum wire for example). Here, the lead terminals 150 may be electrically connected to the circuit board 110 without the use of the wire 151.

The sealing resin 170 protects the circuit board 110 and joints between the circuit board 110 and the lead terminals 150. In the present embodiment, parts of the circuit board 110, the base member 130, and the lead terminals 150 at least touching the sealing resin 170 are covered with a macromolecular material having a higher adhesiveness with the sealing resin 170 than each of constituent components (not shown in the figures, polyamide resin for example). By adopting a configuration covered with such a macromolecular material, it is possible to improve the peeling resistance of the sealing resin 170. Further, in the covered state, the sealing resin 170 covers: the circuit board 110; portions of the base member 130 except the surface opposite the surface to which the circuit board is bonded and flanges 134; and parts of the lead terminals 150 including the portions connected with wire 151. That is, in the base member 130, the surface opposite the surface to which the circuit board 110 is bonded, the flanges 134, and parts of the lead terminals 150 are exposed to exterior. More specifically, as shown in FIG. 2, the whole surface of the base member 130 opposite the surface to which the circuit board 110 is bonded is exposed to exterior. By adopting such a configuration, it is possible to: increase the area through which heat can be dissipated from the base material 130 directly to exterior without involving the sealing resin 170; and thus further improve heat dissipativity. In addition, since the mold size of the sealing resin 170 is also reduced by the downsizing of the circuit board 110, it is possible to suppress cracking and exfoliation of the sealing resin 170 even when a part of the base member 130 is exposed to exterior (even when all the portions except the flanges 134 in the base member 130 are not covered with the sealing resin 170).

As the constituent material of the sealing resin 170, any material can be adopted as long as the material can protect the circuit board 110 and the joints between the circuit board 110 and the lead terminals 150 in the usage environment. In the present embodiment, a thermosetting resin (epoxy resin for example) having a linear expansion coefficient of 8 to 12 ppm/° C. and an elastic coefficient of 12 to 25 GPa at room temperature is adopted. As stated above, in the present embodiment, the linear expansion coefficients of the circuit board 110, the base member 130, and the sealing resin 170 are small and the circuit board 110 is downsized by the effects of both side mounting and others. By the effects, the mold size of the sealing resin 170 is reduced (44 mm square in the planar direction of the circuit board 110). Consequently, it is possible to suppress the generation of exfoliation and cracking in the sealing resin 170 even when a surface of the base member 130 is exposed.

As stated above, in an electronic controller 100 according to the present embodiment, electronic components 114, in addition to thick film resistors 113, are mounted on the bottom surface of the circuit board 110 and a first concave portion 131 is formed at the portion of the base member 130 corresponding to the electronic components 114. As a result, the circuit board 110 (the electronic controller 100) can be downsized. In the present embodiment in particular, the balance of the element occupied areas between the top and bottom surfaces of the circuit board 110 is adjusted by the allocation of the thick film resistors 113 and the ceramic chip resistors 115c, those being resistance elements. Consequently, the circuit board 110 can be downsized efficiently.

Further, the electronic components 114 attached with solder 117 are mounted on the bottom surface of the circuit board 110 and the electronic components 115 attached not by soldering are mounted on the top surface thereof. Consequently, the complication of processes caused by the coexistence of the mounting with the solder 117 and the mounting without the solder 117 can be avoided and the mounting processes can be simplified. In the present embodiment in particular, lump mounting is applied to the top surface of the circuit board 110 with an electrically conductive adhesive 119 (Ag paste) and lump mounting is applied to the bottom surface thereof with the solder 117, and thus the electrically conductive adhesive 119 and the solder 117 can be efficiently supplied to the mounting surfaces by printing respectively. In addition, it is possible to avoid the processes of: sticking a masking tape to positions where wire connection is applied at mounting by soldering; peeling off the masking tape after the mounting; and further applying wet cleaning or plasma cleaning.

Further, in the elements 112, the bare chips 115a and 115b are disposed on the top surface of the circuit board 110 and electrically connected to the circuit board 110 with wire 120. Consequently, it is possible to improve reliability in connection in comparison with the configuration wherein elements mounted not by soldering are disposed on the bottom surface of the circuit board.

Furthermore, since parts of the base member 130 are exposed from the sealing resin 170 to exterior, heat dissipativity can be improved. In the present embodiment in particular, the heater elements 115a and 115b are disposed at positions 121 on the top surface of the circuit board 110 corresponding to the position where the thick film resistors 113 are dispose. Consequently, the heater elements 115a and 115b are disposed on the top surface of the circuit board 110 and thus heat can be dissipated efficiently to the side of the base member 130 even with the configuration wherein the first concave portion 131 is formed on the base member 130.

Here, in the present embodiment, the example wherein iron is used as the constituent material of the base member 130 is shown. However, besides that, it is also possible to adopt a laminated body formed by interposing an iron nickel alloy between copper, a sintered body of aluminum and silicon carbide, or a sintered body of copper and cuprous oxide. In the ease of the laminated body formed by interposing an iron nickel alloy between copper for example, the linear expansion coefficient is 4 to 13 ppm/° C., the elastic coefficient is 100 to 150 GPa, and the thermal conductivity is 15 to 50 W/mK in the thickness direction and 90 to 320 W/mK in the planar direction. Consequently, the exfoliation and cracking generated in the sealing resin 170 can be reduced to a lower level than iron while the difference in the linear expansion coefficient of the base member 130 from the circuit board 110 and the sealing resin 170 is reduced. Further, heat dissipativity can be improved to a level higher than iron. In contrast, in the ease of a sintered body of aluminum and silicon carbide, the linear expansion coefficient is 8 to 15 ppm/° C., the elastic coefficient is 100 to 130 GPa, and the thermal conductivity is 150 to 200 W/mK. In the case of the sintered body of copper and cuprous oxide, the linear expansion coefficient is 9 to 17.8 ppm/° C., the elastic coefficient is 50 to 120 GPa, and the thermal conductivity is 120 to 380 W/mK. Consequently, with the sintered body of aluminum and silicon carbide or the sintered body of copper and cuprous oxide too, the same effects as the case of the laminated body formed by interposing an iron nickel alloy between copper can be expected.

Figure 6:
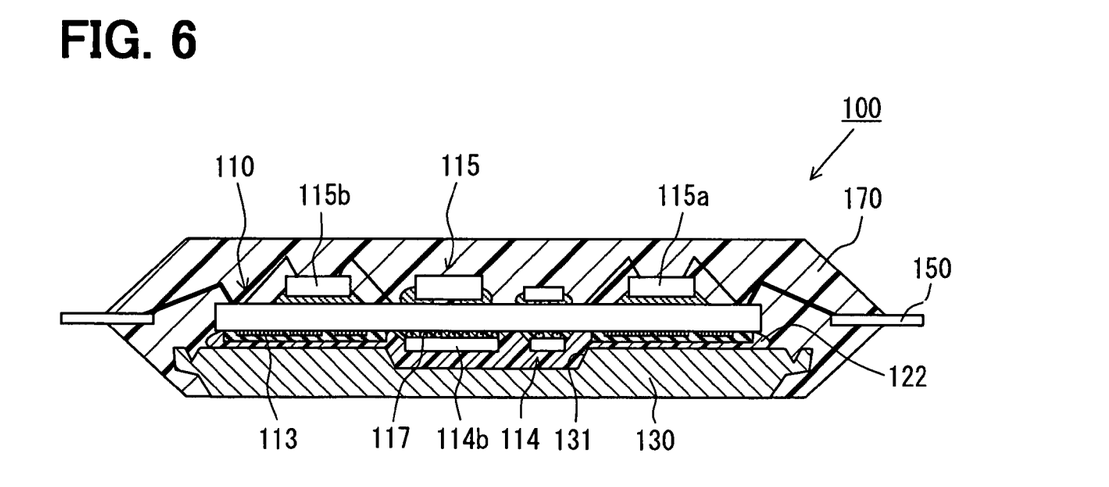
FIG. 6 shows a cross-sectional view of a modification of the circuit board.

Furthermore, in the present embodiment, the example wherein the heater elements 115a and 115b are disposed only on the top surface of the circuit board 110 is shown. However, as shown in FIG. 6 for example, the configuration wherein the heater elements 114b are disposed on the bottom surface of the circuit board 110 as the electronic components 114 may be adopted. By the configuration, it is possible to shorten the heat transfer route from the heater elements 114b to the base member 130 and improve heat dissipativity in comparison with the configuration wherein the heater elements are disposed on the top surface thereof. Here, as the heater elements 114b disposed on the bottom surface of the circuit board 110, it is possible to adopt heater elements that are packaged and mounted on the circuit board 110 with solder 117. FIG. 6 is a sectional view showing a modified example of the circuit board 110 and corresponds to FIG. 2. In FIG. 6, the configuration wherein the heater elements 114b, 115a, and 115b are disposed on both the surfaces of the circuit board 110 is shown but a configuration wherein the heater element 114b are disposed only on the bottom surface may also be adopted.

Figure 7:
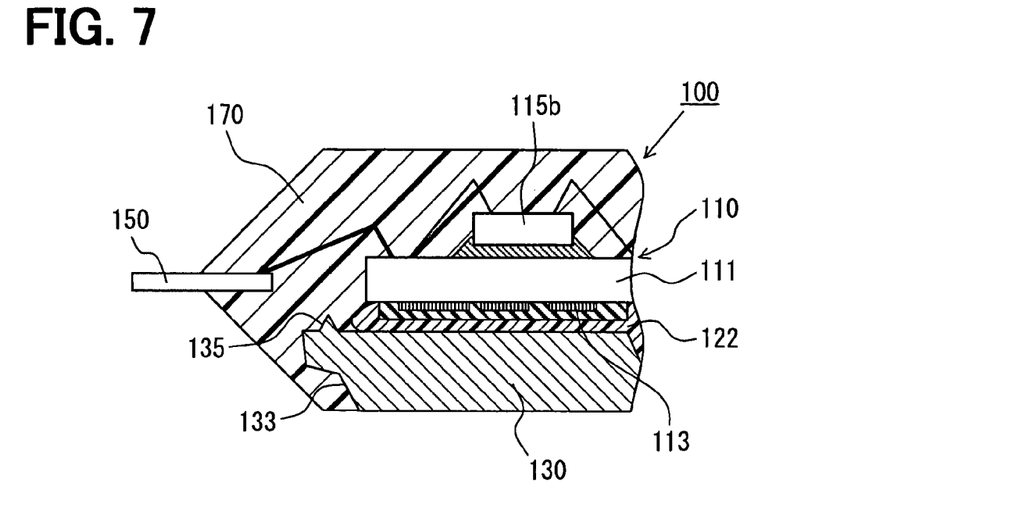
FIG. 7 shows a partial cross-sectional view of the circuit board regarding a modification of a base member.

Further, in the present embodiment, an example wherein the second recess 132 and the step 133 are formed at positions of the base member 130 where the base member 130 touches the sealing resin 170 is shown. As shown in FIG. 7 however, it may also be configured so as to form a protrusion 135 at the position of the base member 130 where the base member 130 touches the sealing resin 170. By so doing too, it is possible to improve peeling resistance by the effect of the increase of the contact area and the so-called anchor effect. FIG. 7 is an enlarged sectional view showing a modified example of the base member 130. FIG. 7 shows a configuration wherein the protrusion 135 and the step 133 are formed at the positions of the base member 130 where the base member 130 touches the sealing resin 170. However, a configuration wherein only the protrusion 135 is formed may be adopted. That is, at least one of the protrusion 135, the second recess 132, and the step 133 may be formed at a position of the base member 130 where the base member 130 touches the sealing resin 170.

Further, in the present embodiment, an example wherein the flanges 134 of the base member 130 are formed as members different from the other portions of the base member 130 is shown. However, the flanges 134 may be integrally formed as parts of the base member 130 with the same material as the base member 130.

Figure 8:
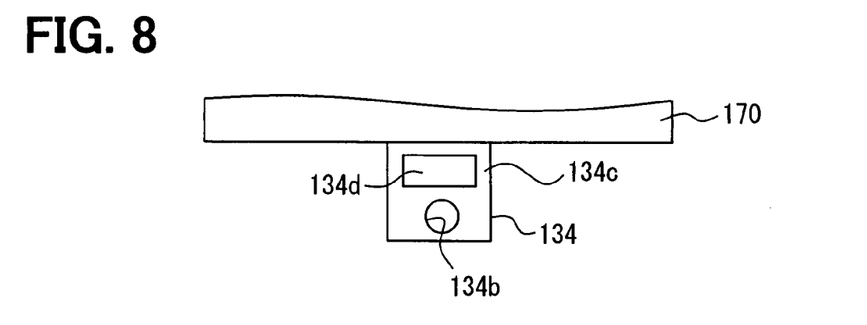
FIG. 8 shows a plan view of the lead frame regarding a modification of the flange.

Further, in the present embodiment, an example wherein, in each of the flanges 134, the portion between the sealing resin 170 and the portion having a tapped hole 134b (the portion where a slit is formed with the sealing resin 170) in each of the two beams protruding from the portion having the tapped hole 134b and being formed in a flexible manner is used as a stress reliever 134c is shown. However, the stress relievers 134c are not limited to the aforementioned configuration. As shown in FIG. 8 for example, it is also possible to: form a slit 134d directly at a portion between the portion having a tapped hole 134b and the portion sealed with the sealing resin 170; and use the portion that has become thinner and flexible due to the slit 134d as a stress reliever 134c. FIG. 8 is an enlarged plan view showing a modified example of a flange 134. By adopting such a configuration, it is possible to mitigate stress when the stress is applied from exterior while stable support is maintained regularly.

Figure 9A:
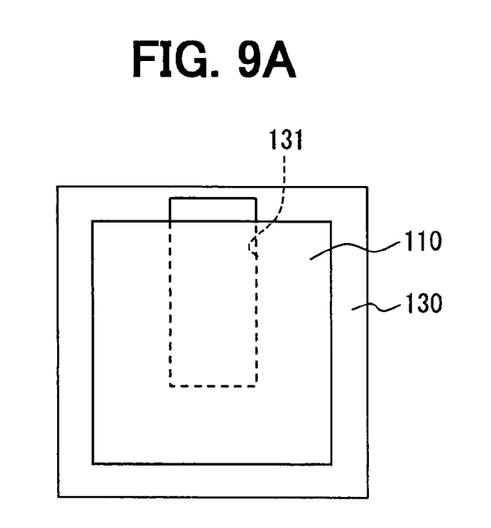
FIGS. 9A and 9B show a plan view of a first concave portion illustrating modifications thereof.
Figure 9B:
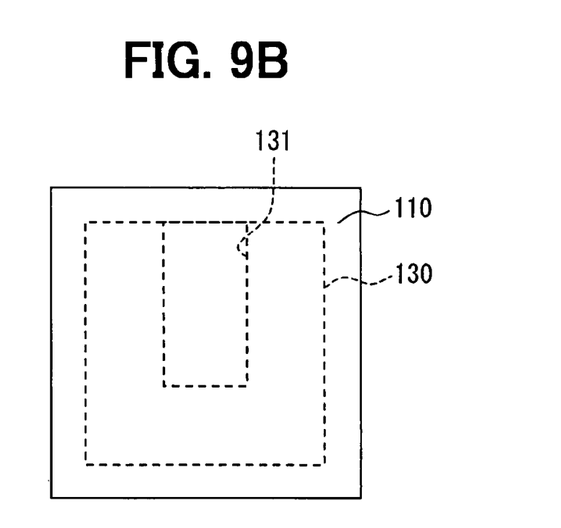

Further, in the present embodiment, an example wherein the first concave portion 131 formed in the base member 130 is a hole formed so that both the ends thereof may be exposed outside the region where the circuit board 110 is disposed and the first concave portion 131 may not open at the end face (the side face except the surface to which the circuit board 110 is bonded and the surface opposite the surface thereof) in the state where the circuit board 110 is placed is shown. However, a configuration wherein only one end is exposed outside the region where the circuit board 110 is disposed as shown in FIG. 9A may be adopted. Otherwise, a configuration wherein at least one end of the first concave portion 131 is extended up to the end face of the base member 130 and the first concave portion 131 opens at the end face as shown in FIG. 9B may be adopted. In any of those cases, similar effects can be expected. FIGS. 9A and 9B are schematic plan views showing modified examples of the first concave portion 131. Here, the configuration shown in FIG. 9B: is not limited to the case where the base member 130 is smaller than the circuit board 110 as shown in FIG. 9B; and, besides that, can be adopted also in the case where the base member 130 has the same shape and size as the circuit board 110.

Second Embodiment

Figure 10:
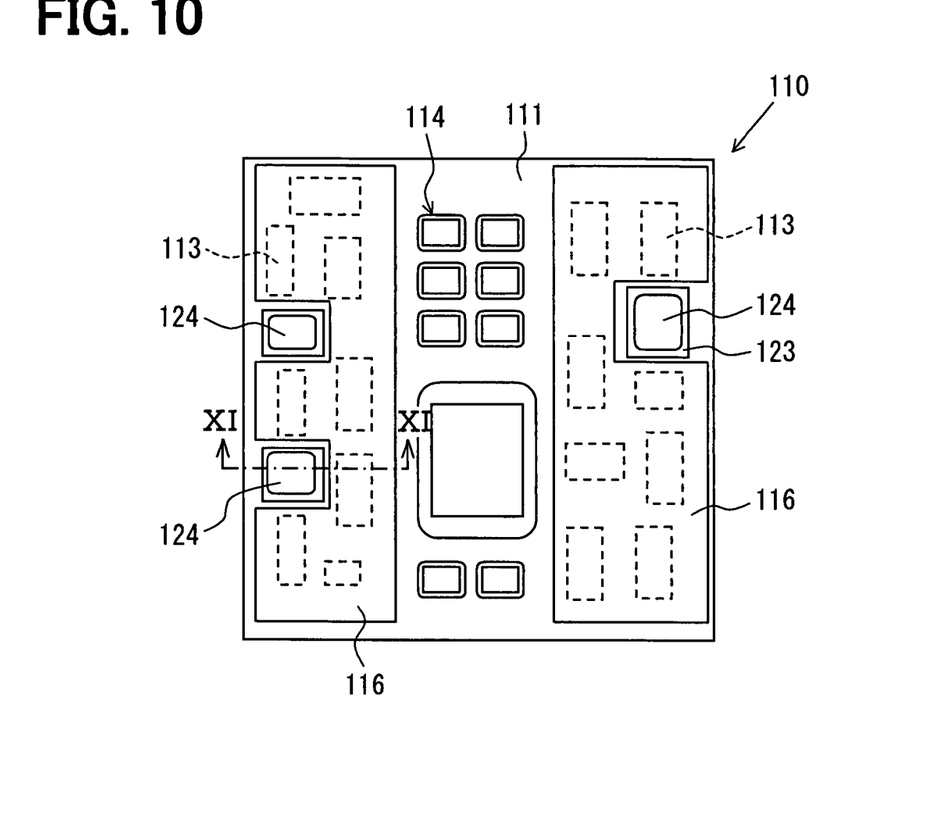
FIG. 10 shows a plan view of the lower side of the circuit board of the electronic controller in a second embodiment of the present disclosure.
Figure 11:
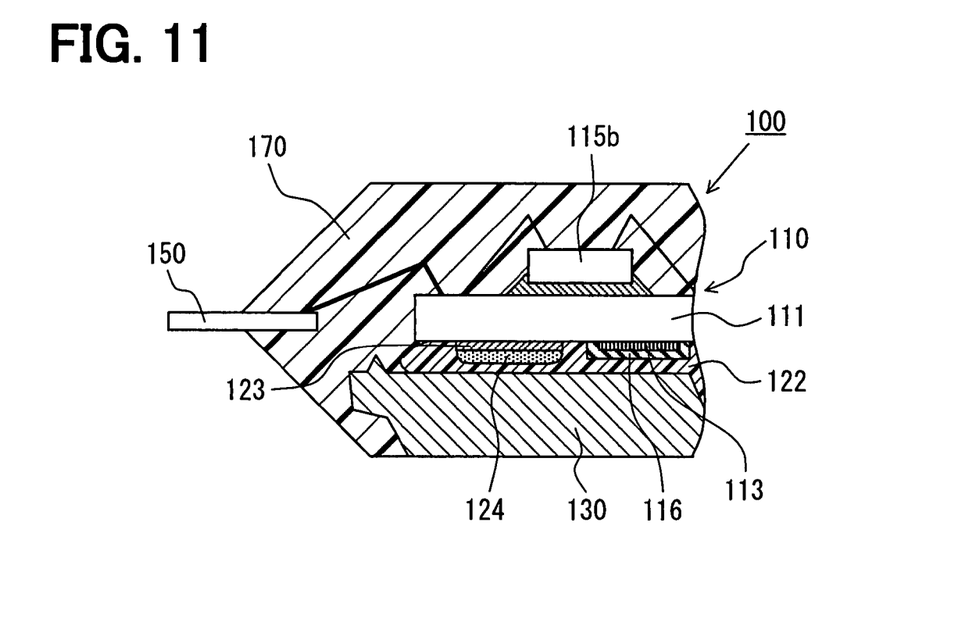
FIG. 11 shows a partial cross-sectional view of the electronic controller along a line XI-XI shown in FIG. 10.

The second embodiment of the present invention is hereunder explained in reference to FIGS. 10 and 11. FIG. 10 is a plan view showing the general configuration on the bottom surface of a circuit board 110 as a substantial part in an electronic controller 100 according to the second embodiment. FIG. 11 is a schematic sectional view of the electronic controller 100 taken on line II-II shown in FIG. 10.

The electronic controller 100 according to the second embodiment has many similarities to the electronic controller 100 shown in the first embodiment. Hereunder therefore, detailed explanations on similar portions are omitted and different portions are explained intensively.

In the first embodiment, the example wherein the region where the thick film resistors 113 as elements 112 are disposed is differentiated from the region where the electronic components 114 as elements 112 are disposed on the bottom surface of the circuit board 110 is shown. In contrast, the present embodiment is, as shown in FIGS. 10 and 11, characterized in that, when there is a space between adjacent thick film resistors 113 in the region where the thick film resistors 113 are disposed, a land 123 that does not provide electrical connecting function is formed in the space and a dummy solder 124 comprising solder is formed on the land 123. Here, the dummy solder 124 can be integrally formed when solder 117 is printed.

As shown in the first embodiment, the thick film resistors 113 are covered with the dielectric films 116. The thermal conductivity of the dielectric films 116 is about 0.5 W/mK. In contrast, the thermal conductivity of the solder composing the dummy solder 124 is about 60 W/mK. Consequently, by an electronic controller 100 according to the present embodiment, it is possible to efficiently dissipate heat generated in the heater elements 115a and 115b (in FIG. 11, only a heater element 115b is shown) disposed on the top surface of the circuit board 110 toward the side of the base member 130 through the dummy solder 124. On this occasion, the balance of the areas occupied by elements 112 may be adjusted by adding the dummy solder 124 to the resistance elements 113 and 115c.

Third Embodiment

Figure 12A:
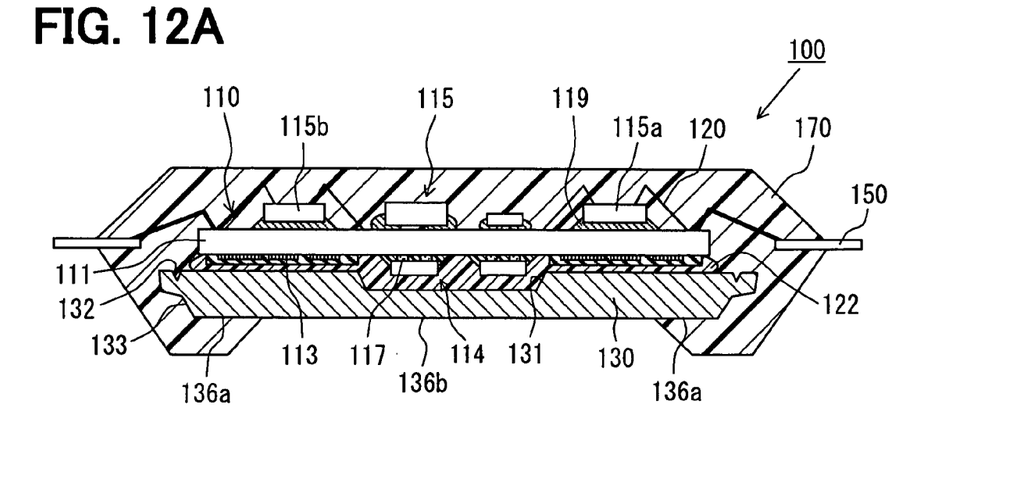
FIG. 12A shows a cross-sectional view of the electronic controller in a third embodiment.
Figure 12B:
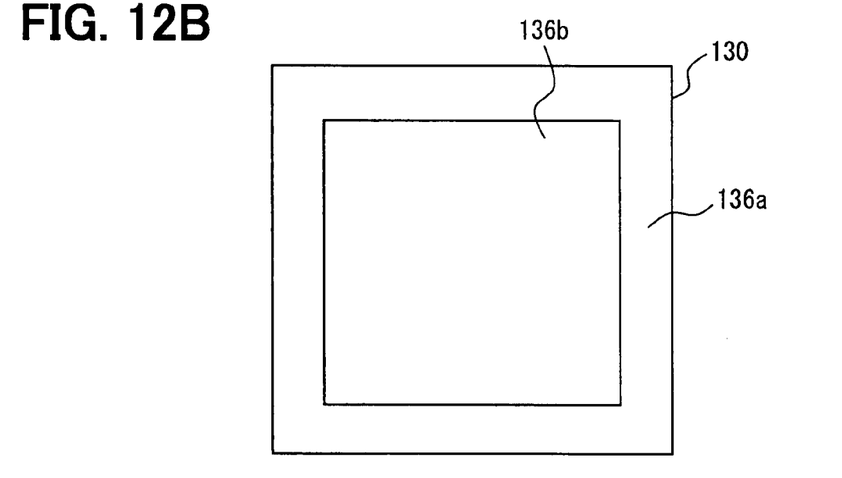
FIG. 12B shows a plan view of a lower side of the base member of the electronic controller.

The third embodiment of the present invention is hereunder explained in reference to FIG. 12. FIG. 12 comprises views showing a general configuration of an electronic controller 100 according to the third embodiment. FIG. 12A is a sectional view thereof and FIG. 12B is a plan view showing the surface of the base member 130 as the substantial part opposite the surface to which a circuit board 110 is bonded.

The electronic controller 100 according to the third embodiment has many similarities to the electronic controller 100 shown in the first embodiment. Hereunder therefore, detailed explanations on similar portions are omitted and different portions are explained intensively.

In the first embodiment, the example wherein the whole surface of the base member 130 opposite the surface to which the circuit board 110 is bonded is exposed to exterior is shown. In contrast, the present embodiment is, as shown in FIGS. 12A and 12B, characterized in that, on the surface of the base member 130 opposite the surface to which the circuit board 110 is bonded, a periphery 136a is molded with sealing resin 170 and the center portion 136b surrounded by the periphery 136a is exposed to exterior. In the present embodiment in particular, it is configured so that the area of the center portion 136b may be larger than the area of the periphery 136a. Further, at least parts of the heater elements 115a and 115b are disposed at positions of the circuit board 110 corresponding to the center portion 136b exposed to exterior.

As stated above, in an electronic controller 100 according to the present embodiment, the base member 130 is formed so as to be surrounded by the sealing resin 170 disposed at the periphery 136a on the surface opposite the surface to which the circuit board 110 is bonded and the retentive power of the base member 130 increases. Further, the contact area also increases. Consequently, it is possible to improve the peeling resistance of the sealing resin 170 against the base member 130.

Here, as the area of the periphery 136a covered with the sealing resin 170 increases, the peeling resistance of the sealing resin 170 against the base member 130 improves but in contrast heat dissipativity deteriorates. On the other hand, in the present embodiment, since it is configured so that the area of the center portion 136b exposed to exterior may be larger than the area of the covered periphery 136a, it is possible to improve peeling resistance without extremely hindering heat dissipativity. Moreover, at least parts of the heater elements 115a and 115b are disposed as electronic components at the position of the circuit board 110 corresponding to the center portion 136b exposed to exterior, namely at the position corresponding to the center portion of the circuit board 110. Consequently, heat can be dissipated efficiently even though it is configured so that a part of the surface of the base member 130 opposite the surface to which the circuit board 110 is bonded may be molded with the sealing resin 170.

Although the present invention has been fully described in connection with the preferred embodiment thereof with reference to the accompanying drawings, it is to be noted that various changes and modifications will become apparent to those skilled in the art.

Figure 13:
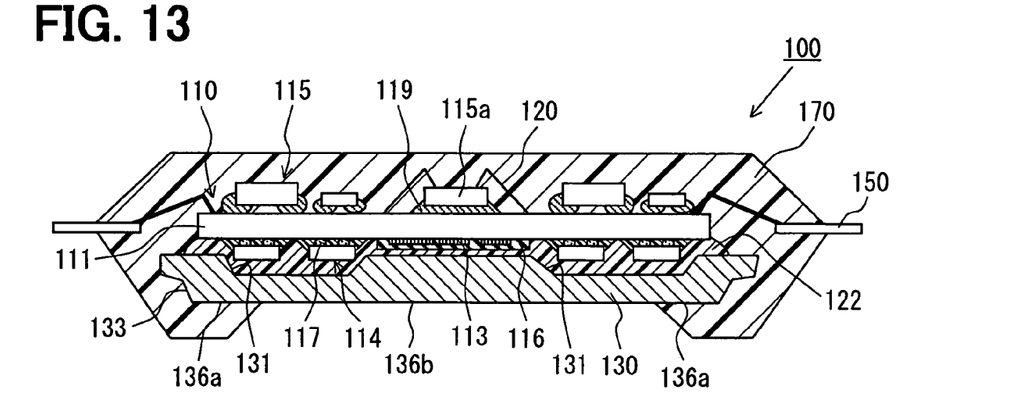
FIG. 13 shows a cross-sectional view of the electronic controller regarding another modification.

In the above embodiments, the thick film resistor region and the electronic component region are separated from each other on the bottom surface of the circuit board 110. However, the resistor 113 and the electronic component 114 may be mingled in a same region. Further, two electronic component regions may be interposed by the resistor region as shown in FIG. 13 instead of one electronic component region interposing in two resistor regions. That is, the number of regions and arrangement pattern of both regions may be arbitrarily determined. FIG. 13 illustrates a cross section of another modification of the electronic controller.

As shown in FIG. 13, by disposing the heater element 115a on a reverse side of the thick film resistor region, heat dissipation efficiency in the configuration that has the thick film resistor region interposed between two electronic component regions is improved. In this configuration, the whole heater element 115a is easily disposed at a portion that corresponds to the center portion 136a in the circuit board 110 being exposed to exterior. Therefore, the heat dissipation efficiency in the configuration that a portion of the reverse side of the surface that has the circuit board 110 of the base member 130 adhered thereto is molded by the sealing resin 170 is further improved.

In the above embodiments, the portion of the base member 130 to be exposed from the sealing resin 170 is the reverse side of the surface that has the circuit board 110 adhered thereto. However, the edges as well as the reverse side may be configured to be exposed. For example, an upper section (the side that circuit board 110 is adhered to) of the step part 133 may have the sealing resin 170 disposed thereon. In this manner, heat dissipation efficiency is further improved.

In the above embodiments, the elements has the thick film resistor 113 and the electronic component 114 soldered by the solder 117 on the bottom side (the base member 130 adhered side) and has the electronic component 115 including the bare chip 115a, 115b connected by wire without soldering on the top side as the circuit board 110. However, the electronic controller having the circuit board, the base member, the external terminal and the sealing resin may have the thick film resistor disposed on the bottom side of the circuit board together with the electronic components disposed on both of the top and the bottom sides, and the electronic controller may also have the first concave portion at the position in correspondence with the electronic components on the base member adhered side with the reverse side of the side that has the circuit board of the base member adhered thereto having the center portion surrounded by the periphery of molding and the external terminal exposed to exterior (the configuration in the third embodiment with the definition of the circuit board being altered). When such a configuration is adopted, the electronic component is implemented as well as the thick film resistors on the bottom side of the circuit board, and the first concave portion is disposed at a position of the base member corresponding to the position of the electronic component. Therefore, miniaturization of the circuit board (the electronic controller) is achieved. Further, as a portion of the base member is exposed from the sealing resin, the heat dissipation efficiency is improved, and the sealing resin anti-exfoliation character from the base member is improved by having the sealing resin on the periphery. In this case, the center portion may have a greater area than the area of the periphery for improving the anti-exfoliation character without substantially affecting the heat dissipation efficiency. In addition, the heater element of large heat dissipation capacity may be disposed at the center portion of the circuit board as the electronic component for improving the heat dissipation efficiency even in the configuration that a portion of the reverse side of the side that has the circuit board of the base member adhered thereto is partially molded by the sealing resin.

Further, the electronic controller having the circuit board, the base member and the external terminal may have the thick film resistor disposed on the bottom side of the circuit board together with the electronic components disposed on both of the top and the bottom sides, and the electronic controller may also have the first concave portion at the position in correspondence with the electronic components on the base member adhered side, with the sealing resin molded circuit board with a portion of the base member and a portion of the external terminal exposed therefrom as well as the heater elements of large heat dissipation capacity positioned on the top surface of the circuit board at an area that corresponds to the position of the thick film resistor (the configuration in the first embodiment with the definition of the circuit board being altered). When such a configuration is adopted, the electronic component is implemented as well as the thick film resistors on the bottom side of the circuit board, and the first concave portion is disposed at a position of the base member corresponding to the position of the electronic component. Therefore, miniaturization of the circuit board (the electronic controller) is achieved. Further, as a portion of the base member is exposed from the sealing resin, the heat dissipation efficiency is improved. Furthermore, because an interval between the bottom surface of the circuit board and the base member is narrower at the first concave portion than the thick film resistor formation portion, thereby enabling an efficient heat dissipation from the heater element on the top surface toward the base member side is achieved. In addition, the above configuration may be altered to have the separate resistor/component area with the no-electric connection land having dummy soldering interposed between two adjacent thick film resistors. In this manner, because the surface of the resistor is coated by an insulation membrane and the dummy land portion has a greater heat conductivity than the insulation membrane, the heat from the heater element on the top surface is efficiently dissipated toward the base member.

Such changes and modifications are to be understood as being within the scope of the present invention as defined by the appended claims.

What is claimed is:

1. An electronic controller comprising:
   a circuit board that has an element mounted thereon for composing a circuit;
   a base member that has the circuit board adhesively fixed thereon; and
   an external terminal that is electrically connected to the circuit board,
   wherein a base member facing side of the circuit board that is adhered to the base member has as the element a thick film resistor disposed thereon and an electronic component that is mounted thereon by soldering, a reverse side of the circuit board that opposes the base member facing side to be adhered to the circuit board has as the element an electronic component that includes a bare-chip that is at least connected by wire for mounting without soldering, a first side of the base member that has the circuit board adhered thereto has a first concave portion at a position that corresponds to the electronic component being mounted on the circuit board, the circuit board is molded with a part of the base member and a part of the external terminal respectively being exposed from molding, and the first concave portion has in a planar direction of the circuit board at least one of an end that has an opening on an end surface of the base member and a portion that extends out of a disposition area of the circuit board on the base member.

2. The electronic controller of claim 1, the circuit board has a thick film resistor disposition and an electronic component disposition area on a side that is adhered to the base member, and the base member has one piece of the first concave portion in correspondence to a plurality of the electronic components.

* * * * *